US007823941B2

(12) United States Patent
Caldwell et al.

(10) Patent No.: US 7,823,941 B2
(45) Date of Patent: Nov. 2, 2010

(54) HANDLING DEVICE

(75) Inventors: Darwin Gordon Caldwell, Hawkshaw (GB); Steven Thomas Davis, Manchester (GB)

(73) Assignee: The University of Salford, Manchester (GB)

( * ) Notice: Subject to any disclaimer, the term of this patent is extended or adjusted under 35 U.S.C. 154(b) by 0 days.

(21) Appl. No.: 12/092,637

(22) PCT Filed: Nov. 1, 2006

(86) PCT No.: PCT/GB2006/004069

§ 371 (c)(1),
(2), (4) Date: May 5, 2008

(87) PCT Pub. No.: WO2007/052018

PCT Pub. Date: May 10, 2007

(65) Prior Publication Data

US 2008/0292446 A1    Nov. 27, 2008

(30) Foreign Application Priority Data

Nov. 4, 2005    (GB)    ................................ 0522552.9

(51) Int. Cl.
*B66C 3/00*    (2006.01)
(52) U.S. Cl. .................................................... 294/64.3
(58) Field of Classification Search ....... 294/64.1–64.3; 901/40; 414/752.1
See application file for complete search history.

(56) References Cited

U.S. PATENT DOCUMENTS 3,195,941 A * 7/1965 Morey ........................ 294/64.1
3,438,668 A * 4/1969 Williams et al. ............ 294/64.3
3,523,706 A * 8/1970 Logue ........................ 294/64.3
4,735,449 A * 4/1988 Kuma ........................ 294/64.3
4,921,520 A * 5/1990 Carlomagno ............... 294/64.3
4,969,676 A * 11/1990 LaMagna ................... 294/64.3
6,601,888 B2 * 8/2003 McIlwraith et al. ........ 294/64.3
7,516,995 B2 * 4/2009 Jaksic ........................ 294/64.3
7,665,783 B2 * 2/2010 Nishio ....................... 294/64.1

FOREIGN PATENT DOCUMENTS

DE    1531192    7/1969
DE    19733215    2/1999

OTHER PUBLICATIONS

Search Report for PCT/GB2006/004069.

* cited by examiner

*Primary Examiner*—Paul T Chin
(74) *Attorney, Agent, or Firm*—Woodard Emhardt Moriarty McNett & Henry

(57) ABSTRACT

A Bernoulli Effect pick-up device (1) for the handling of products (20) comprises a surface (4) adapted such that gaseous fluid flow across said surface (4) provides a pick-up force to be generated, by the Bernoulli Effect, in a direction towards said surface (4), and a conduit (2) for the supply of the gaseous fluid. The conduit (2) has an outlet opening (5) at the surface (4) and is adapted to supply gaseous fluid in a direction opposed to the pick-up direction. The outlet (5) of the conduit (2) is associated with a deflector (9) for directing gaseous fluid across the surface (4) and preventing direct impingement of the fluid on a product (2) that has been picked-up by the device (1). The product (20) may for example be a slice of a foodstuff, e.g. tomato or hard-boiled egg.

9 Claims, 3 Drawing Sheets

HANDLING DEVICE

CROSS REFERENCE TO RELATED APPLICATIONS

Figure 1:
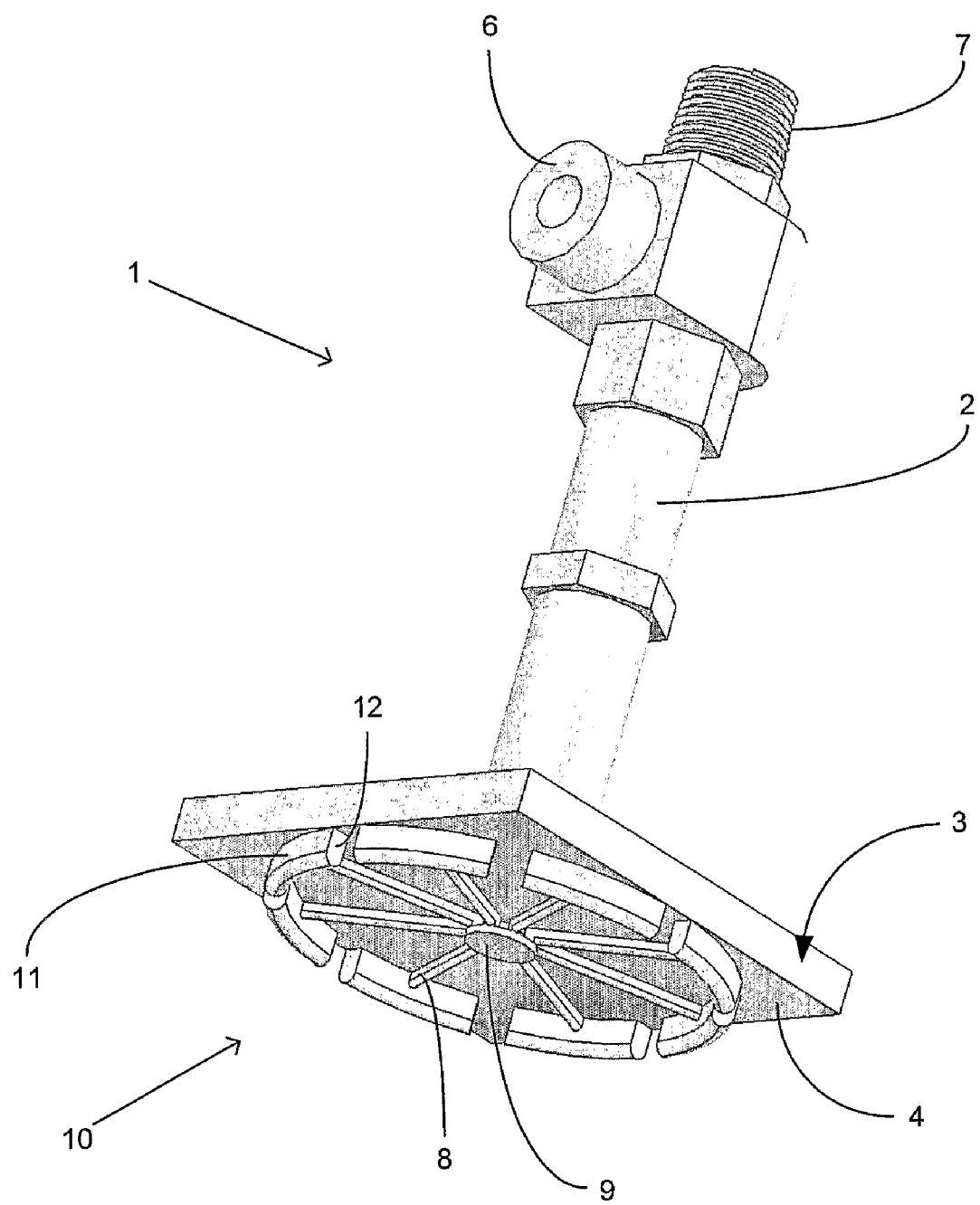

This application is a national stage of International Application No. PCT/GB2006/004069 filed Nov. 1, 2006, which claims priority to United Kingdom Application No. 0522552.9 filed Nov. 4, 2005.

The present invention relates to a handling device that utilises the Bernoulli effect for use in "picking-up" a product, e.g. for the purposes of transferring the product from one location to another. The invention relates more particularly, but not necessarily exclusively, to such devices that are for use in handling products of a delicate nature (e.g. slices of a foodstuff such as tomato) without damage to the product.

The automated "pick-up" handling of delicate products whilst avoiding damage to the product can be difficult to achieve and so many such operations are still carried out manually. Thus, for example, in the food preparation industry certain operations (e.g. the handling and positioning of tomato slices on bread in commercial sandwich manufacture) are carried out manually because no suitable apparatus exists for automating the task without damage to the product. Thus, for example, automated robotic handling apparatus generally have end-effectors/grippers which utilise either fingers or vacuum cups to hold objects. Whilst these are well suited in traditional engineering, the delicate nature of many products handled in the food industry means these techniques are often unsuitable.

Various pick-up devices based on the Bernoulli effect are known but to our knowledge are not currently used in the food preparation industry.

Bernoulli's principle states that as the speed of a moving fluid (e.g. gas) increases there is a reduction in the pressure with the fluid. This principle has numerous practical applications and has been employed in so-called Bernoulli Effect pick-up devices. Such prior devices comprise an air (or other gaseous fluid) supply conduit that opens on to a surface which, in use of the device, is positioned in close proximity to a product (usually flat) that is to be picked-up by the device. Air (or other gaseous fluid) is caused to flow along the conduit and issue from the orifice. Since the product to be lifted is in close proximity with the aforementioned surface of the device, the air issuing from the orifice undergoes a change in direction to flow between the surface and the product. This flow of air (between the surface and the product) generates a "lifting force" and provided that the airflow is sufficient then the "lifting force" will exceed downward forces on the product (particularly gravity but also the impact of the air issuing from the orifice on to the product) and allow the product to be supported in close proximity to the surface.

Bernoulli Effect pick-up devices of the type described in the previous paragraph have been used, for example, for the handling of silicon wafers and other relatively robust materials.

However the Bernoulli Effect pick-up devices proposed in the prior art are not generally suitable for the handling of products of rather more delicate structural composition, e.g. slices of foodstuffs such as meats, vegetables and fruits. This is particularly so where one component of the foodstuff is relatively easily dislodged from another component. Particular examples of such foodstuffs are slices of tomato and cucumber, in which case the seeds may easily be dislodged from the flesh.

It is therefore an object of the present invention to obviate or mitigate the abovementioned disadvantages.

According to a first aspect of the present invention there is provided a Bernoulli Effect pick-up device for the handling of products, the device comprising a surface adapted such that gaseous fluid flow across said surface provides a pick-up force to be generated, by the Bernoulli Effect, in a direction towards said surface, and a conduit for the supply of the gaseous fluid, said conduit having an outlet opening at said surface and being adapted to supply gaseous fluid in a direction opposed to the pick-up direction wherein said outlet of the conduit is associated with a deflector for directing gaseous fluid across the surface and preventing direct impingement of the fluid on a product that has been picked-up by the device.

Thus, the pick-up device in accordance with the invention, which operates in accordance with the Bernoulli effect, is provided with a deflector associated with the orifice in the surface (and spaced therefrom) such that gaseous fluid flow therefrom is directed across the surface of the device and does not impinge directly on to a product that is to be picked-up by the device. We have found that the pick-up head of the invention is, because of the provision of the deflector, eminently suitable for use in picking-up slices of foodstuff, without damage thereto. The device may be used, for example, for products of a delicate nature, e.g. the pick-up of foodstuffs such as meats, vegetables and fruits (although the use of the device is not limited to such products). The device may be used, for example, for picking up slices of meat such as ham, salami, pepperoni etc. The device is particularly suitable for use in the pick-up of slices of foodstuffs in which one component can be separated relatively easily from another component. Examples of such products are slices of fruit (e.g. tomato and cucumber) incorporating seeds which may readily be separated from the flesh. A further example comprises slices of hard boiled egg where the yolk may be readily separated from the white.

Pick-up devices for use in the invention are particularly suitable for handling operations for moving a product (e.g. a slice of foodstuff) from a first location to a second location. Such a method (which provides a second aspect of the invention) comprises positioning a pick-up head as defined for the first aspect of the invention in the region of the first location (at which the product is provided) with the surface of the device juxtaposed to the product, providing a gaseous fluid flow through said conduit and thereby across said surface so that a pick-up force is exerted on the product greater than its weight, maneuvering the pick-up device relative to the first location, and decreasing the gaseous fluid flow to release the product from the device.

A particular example of such a method in accordance with the invention is for use in an automated method for producing sandwiches, in which case the device may pick-up a slice of foodstuff (e.g. tomato or egg) from a first location and transfer the foodstuff on to a slice of bread as at least part of a filling for a sandwich.

The device of the invention is not only useful for transferring products between locations but also for reducing the moisture content of products (such as fruit slices, e.g. tomato) during the transfer. This has particular advantage for those applications where prior draining of a product is generally required. Thus, once again with reference to sandwich manufacture, tomato slices are generally cut and allowed to drain for 1-2 hours before being made up into a sandwich. The airflows employed in use of the device of the invention can be sufficient to provide a reduction in moisture content which avoids the need for the conventional "draining" operation.

Product handling methods in accordance with the second aspect of the invention are most conveniently conducted using a pre-programmed robotic device. For this purpose, the handling device, (of the first aspect of the invention) finds particular application as an end effector for such a robotic device.

The deflector employed in the device of the invention should be greater size than the orifice. This is to ensure that gaseous fluid issuing from the orifice does not go "directly past" the deflector so as to impinge on to the product being "picked-up" by the device. Conveniently both the orifice and the deflector are circular, with the latter being of greater diameter than the former.

In a preferred embodiment of the device in accordance with the invention, the surface (across which the gaseous fluid flows to provide the pick-up force) is substantially planar and preferably also is provided with contact inhibiting means for inhibiting contact between the product (to be picked-up by the device) and the surface. The contact inhibiting means most preferably comprise a plurality of elongate ribs on the surface, most preferably arranged so as to extend radially from the orifice and be angularly spaced relative to each other. Equiangular spacing is preferred. There will generally be at least four such ribs, with eight being particularly preferred.

The deflector may conveniently be mounted on the inner ends of the ribs that serve as the contact inhibiting means.

The pick-up device of the invention is preferably also provided with position limiting means to limit lateral movement of the product with respect to the pick-up device since otherwise the product may move laterally out of that region of the surface where the "lifting force" is generated.

The position limiting means may be generally circular (and be centred on the centre of the orifice) and comprise a plurality of circumferentially spaced arcuate walls upstanding from the surface.

A particularly preferred embodiment of the device in accordance with the invention comprises both contact inhibiting means and position limiting means, as described above, in such a device, the position limiting means are preferably of greater depth than the contact limiting means.

Figure 2A:
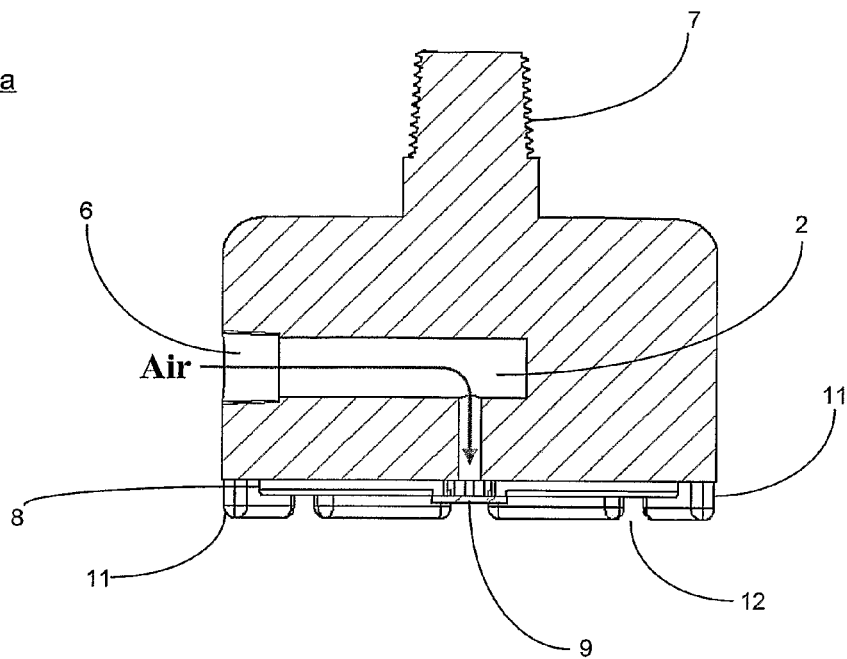
Figure 2B:
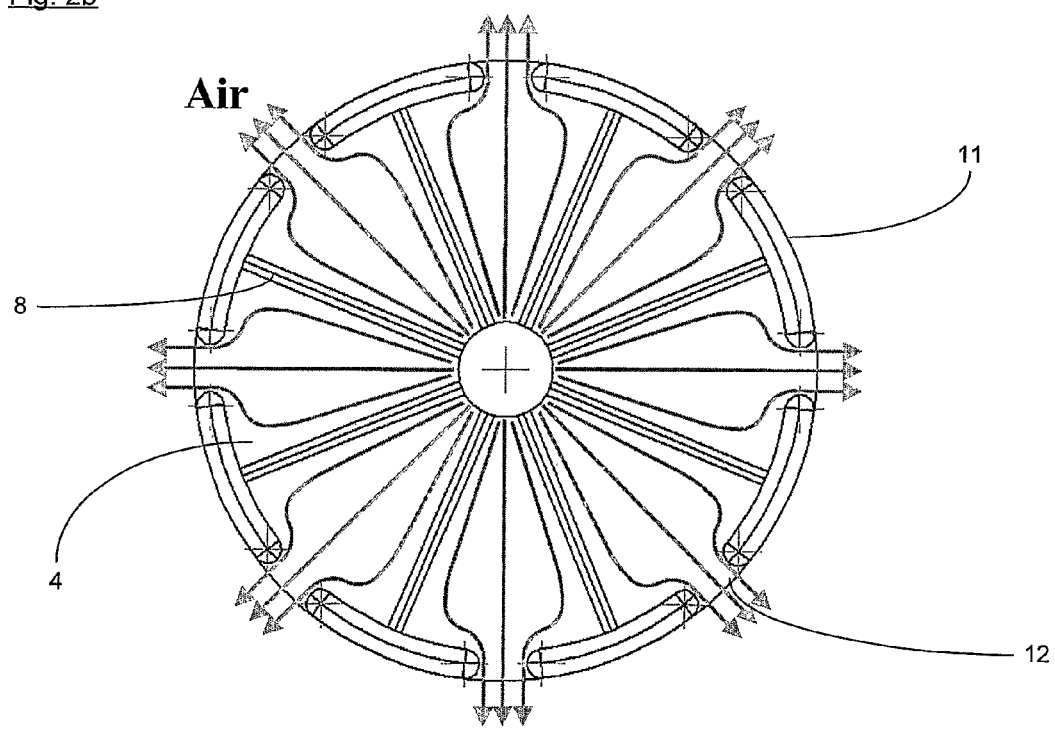
Figure 3:
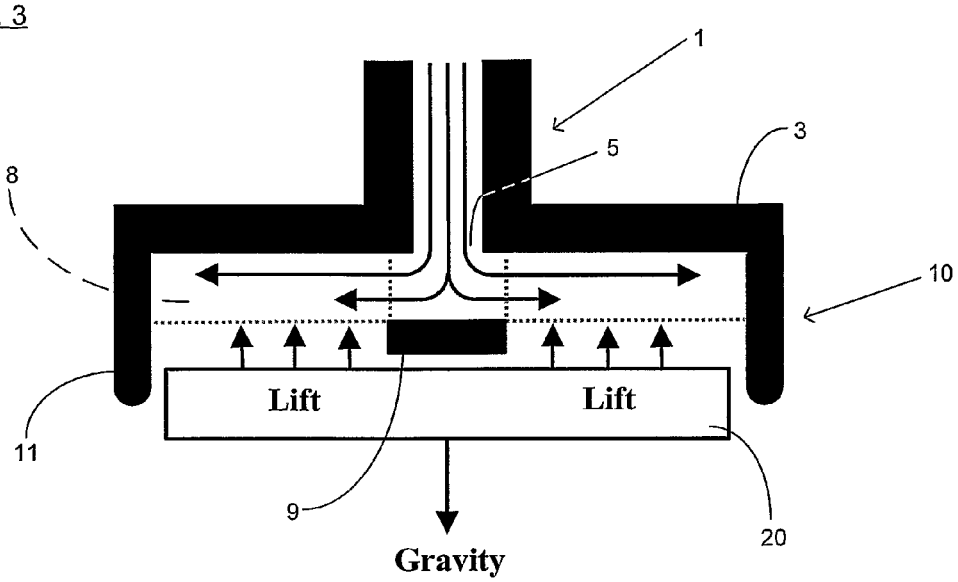
Figure 4:
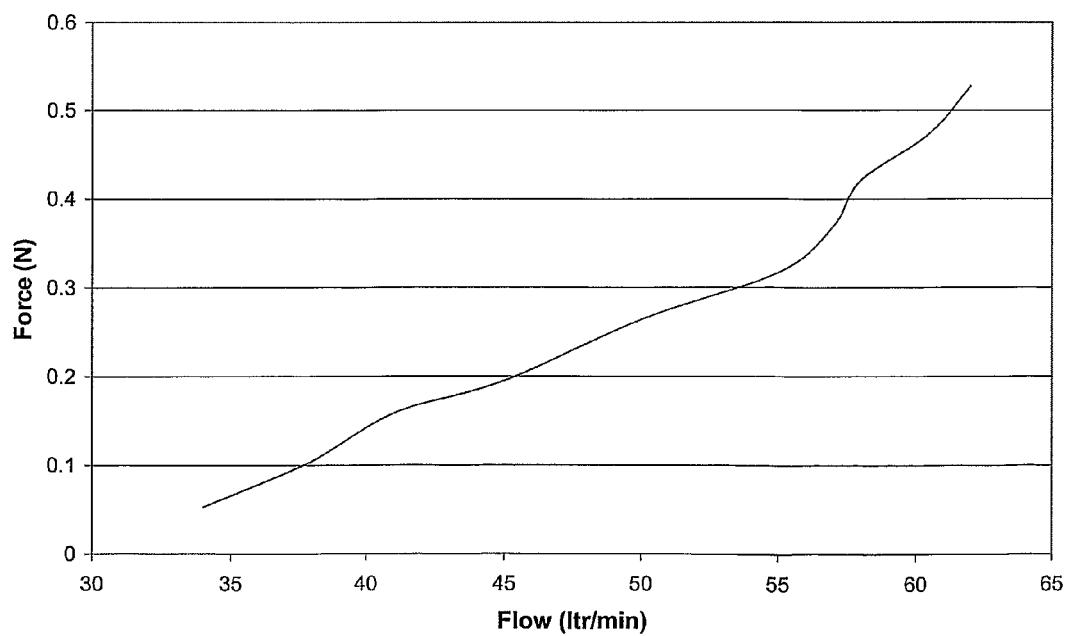

The invention will be further described by way of example only with reference to the accompanying drawings, in which:

FIG. 1 is a perspective view of one embodiment of Bernoulli Effect pick-up device in accordance with the invention;

FIGS. 2 (a) and (b) are respectively sectional and under side views of a further embodiment of pick-up device in accordance with the invention;

FIG. 3 schematically illustrates operation of the devices as shown in FIGS. 1 and 2 for lifting a product; and FIG. 4 is a plot of lifting force generated relative to airflow rate for the device of FIG. 1.

As shown in FIG. 1, a Bernoulli Effect pick-up device 1 comprises an air supply conduit 2 and a plate 3 attached (by means not shown) at its upper surface to the conduit 2. Plate 3 has a generally planar undersurface 4 and is traversed by a central aperture 5 (see also FIG. 3) which is in communication with the supply conduit 2.

Air supply conduit 2 is provided with an air inlet 6 through which air may be supplied for passage along conduit 2 and issuance from orifice 5. Conduit 2 is further provided with a screw-threaded connector 7 for the purpose of mounting the device 1 on a robotic handling device.

On its under surface 4, the plate 3 is provided with a plurality (eight shown) of upstanding ribs 8 that radiate from the bounding edge of orifice 5, the ribs 8 being equiangularly spaced from each other.

Mounted on the inner ends of the ribs 8 is a circular deflector plate 9 which is of greater diameter than orifice 5. It will be appreciated that (by virtue of being mounted on the inner ends of the ribs 8), deflector plate 9 is spaced from surface 4 and overlies the orifice 5.

Further provided on surface is an arrangement 10 for limiting lateral movement of a product picked-up by the device 1 (see description below in relation to FIG. 3). The arrangement 10 is generally circular and comprises a plurality of arcuate walls 11 separated by gaps 12 each located mid-way around the angle subtended between two ribs 8.

The arcuate projections 11 are of greater depth (i.e. in a direct perpendicular to the surface 4) than the ribs 8 for reasons which will be apparent below.

The illustrated device 1 is intended to mounted on a robotic handling device and for this purpose is provided with the aforementioned screw-threaded connector 7. Furthermore, in use, the device will be connected to a variable air pressure supply by means of the inlet 6.

FIG. 2 illustrates a further embodiment of pick-up device which in many respects is of similar construction to that shown in FIG. 1. Thus, for convenience, components that are common to FIGS. 1 and 2 are indicated by the same reference numerals and are not further described. The device of FIG. 2 differs from that of FIG. 1 in that the former has a generally cylindrical head 15 in which are formed the air inlet 6 and air supply conduit 2. More particularly, air inlet 6 is formed in the peripheral surface of head 16 and the conduit 2 extends radially inwardly therefrom before turning downwardly through 90° to allow air to issue through the aperture 5, the resulting airflow pattern being depicted in FIG. 2.

Reference is now made to FIG. 3 which schematically illustrates operation of the pick-up device shown in FIG. 1.

With particular reference to FIG. 3, the device 1 is illustrated as being used for lifting ("picking-up") a generally flat product depicted by the reference numeral 20. For this purpose, the device is positioned above the product 20 and an airflow is provided downwardly (as viewed in FIG. 3) along conduit 2. The airflow is deflected by the deflector 9 and is directed across the surface 4. As a result, the air flows over the surface of product 20 and an upward lift is generated by the Bernoulli effect. As the flow of air is increased, this lift increases to a point where it exceeds the weight of the product so that the latter is "picked-up" and held by the device.

When picked-up by the device 1, the product 20 is located within the bounds of the positioning arrangement 10. As such, any tendency for lateral movement of the product 10 (i.e. generally parallel to the surface 4) is limited by contact of the product 20 with the arcuate projections 11 of the positioning arrangement 10. Furthermore, the product 10 is prevented from sticking to the surface 4 by means of the ribs 8.

It will be appreciated that the device 1 may be used to move the product 20 between first and second locations. Thus, for example, the product 20 may be provided at a first location to which the device is moved so as to adopt a position as generally depicted in FIG. 3. Once the product 20 has been "picked-up", the device 20 may, for example, be raised, moved sideways and then lowered to allow the product 20 to be deposited at a second location. Release of the product 20 from the device 1 is of course achieved by reducing the airflow to below a certain level.

Pick-up devices of the type illustrated in FIGS. 1 and 2 have a number of advantages.

In particular, the provision of the deflector 9 ensures that air does not impinge directly on to the product 20. This is important since it allows delicate products to be lifted by the device without damage that would otherwise occur by direct air impingement on to the product. Examples of such delicate products are slices of foodstuffs from which one part is readily separable from another, e.g. slices of tomato or cucumber (where the seeds can easily be displaced from the main body of the fruit) or slices of hard boiled egg where the yolk can easily be dislodged.

Further advantages of the illustrated device 1 as applied to the "pick-up" of delicate products are as follows:

(i) The lifting force is spread over the entire surface of the product being lifted thus reducing likelihood of damage.
(ii) Products are lifted using their top surface so that less damage is caused as compared to manual handling.
(iii) The device 1 is supplied with positive pressure rather than vacuum thus eliminating the chance of debris being sucked into, and blocking, air lines.
(iv) The illustrated device 1 has a further advantage in that it has a drying-effect on products it picks-up. This is an advantage, for example, in the commercial manufacture of sandwiches incorporating sliced tomato as a filling.

The following experimental data further illustrates the invention and was obtained using a device of the type illustrated in FIG. 1 in which:

(i) the plate 3 was square and had a size of 60×60×6.3 mm;
(ii) the orifice 5 had a diameter of 3 mm;
(iii) the ribs 8 had a width of 1.5 mm and a height of 2 mm;
(iv) the deflector 9 had a diameter of 10 mm and a thickness of 1 mm; and
(v) the walls 11 had a width of 3 mm and a height of 3.5 mm.

The device was tested to demonstrate the lifting force generated for a range of airflows. The results are shown in FIG. 4 from which it will be seen that a flow rate of about 35 ltr/min provided a lifting force of about 0.07 N which increased generally linearly to about 0.5 N for a flow rate of 60 ltr/min.

The device was further tested to determine its ability to reduce the moisture content of slices of tomato for comparison with techniques conventionally used in the sandwich manufacture industry.

Conventionally, in the sandwich manufacturing industry, tomato slices are typically dried for two hours or so before being made-up into a sandwich, the drying generally being effected in trays having drain holes in their lower surface.

A comparative experiment was therefore conducted to establish the relative efficiency of the conventional drying technique (for tomatoes) with drying achieved using a pick-up device 1. Slices of tomato were weighed before being placed on a rack, in two layers, and dried in a refrigerator for 2 hours. After disposing of the liquid that had accumulated in a collecting tray below the rack, the slices were weighed and the average loss of mass calculated. The experiment was repeated several times and the average loss of mass in two hours was found to be 1.3%. In a manufacturing situation it can be assumed that the loss of mass would be less than this experimental figure (as the slices would be more densely packed in the draining trays, which would reduce the drying effect).

The pick-up device of the preferred embodiment was then used to lift individual slices of tomato for a predetermined length of time. The slices were weighed before and after handling and the loss of mass calculated. The experiment was repeated many times to provide an average figure for the loss of mass. When the predetermined handling time was 1 second the average loss of mass was found to be 0.98%; when the predetermined handling time was 2 seconds the average loss of mass was found to be 1.31%; when the predetermined handling time was 5 seconds the average loss of mass was found to be 2.50%.

Thus, it was found that handling a slice of tomato for 2 seconds with the pick-up device of the preferred embodiment provides a drying effect that is at least equal to allowing the slices to drip dry for 2 hours.

The invention claimed is:

1. A Bernoulli Effect pick-up device for the handling of products, the device comprising a surface adapted such that gaseous fluid flow across said surface provides a pick-up force to be generated, by the Bernoulli Effect, in a direction towards said surface for picking up a product to be handled by the device, a conduit for the supply of the gaseous fluid, said conduit having an outlet opening at said surface and being adapted to supply gaseous fluid in a direction opposed to the pick-up direction wherein said outlet of the conduit is associated with a deflector for directing gaseous fluid across the surface and preventing direct impingement of the fluid on the product that has been picked-up by the device, and a plurality of elongate ribs located on said surface and inhibiting contact between the product and said surface.

2. A device as claimed in claim 1, wherein said surface is substantially planar.

3. A device as claimed in claim 1, wherein said ribs extend radially from said outlet and are angularly spaced relative to each other.

4. A device as claimed in claim 3, wherein the ribs are equiangularly spaced.

5. A device as claimed in claim 3, wherein the deflector is mounted on the radially inner ends of said ribs.

6. A device as claimed in claim 1, further comprising position limiting means for limiting lateral movement of the product with respect to the pick-up device.

7. A device as claimed in claim 6 wherein the position limiting means is of greater depth than the elongate ribs.

8. A device as claimed in claim 7, wherein the position limiting means is circular and comprises a plurality of circumferentially spaced arcuate projections upstanding from said surface.

9. A robotic handling apparatus comprising a Bernoulli Effect pick-up device as claimed in claim 1.

* * * * *